United States Patent [19]

Bittner et al.

[11] Patent Number: 4,527,128

[45] Date of Patent: Jul. 2, 1985

[54] BISTATE LINEAR AMPLIFIER CIRCUIT

[75] Inventors: Harry J. Bittner; Daniel D. Culmer, both of Santa Clara; Walter R. Davis, Sunnyvale, all of Calif.

[73] Assignee: National Semiconductor Corporation, Santa Clara, Calif.

[21] Appl. No.: 529,430

[22] Filed: Sep. 6, 1983

[51] Int. Cl.³ .............................................. H03F 1/02
[52] U.S. Cl. ........................................ 330/9; 330/51
[58] Field of Search ....................... 330/9, 51, 85, 296

[56] References Cited

U.S. PATENT DOCUMENTS 3,737,798  6/1973  Faraguet et al. ...................... 330/51

Primary Examiner—James B. Mullins
Assistant Examiner—G. Wan
Attorney, Agent, or Firm—Gail W. Woodward; Paul J. Winters; Michael J. Pollock

[57] ABSTRACT

A linear amplifier output stage is provided with unity gain buffer means having an input coupled to the output terminal and an output coupled to the stage input. The unity gain buffer means is normally turned off by a control signal. When the amplifier is disabled by switching its bias current off, the buffers are turned on so that the output stage input capacitance is charged or discharged via the buffer means in accordance with the output terminal signal. When a plurality of such amplifiers are commonly coupled to a signal line the off amplifiers cannot be driven into conduction by the operating amplifier's output signal.

6 Claims, 4 Drawing Figures

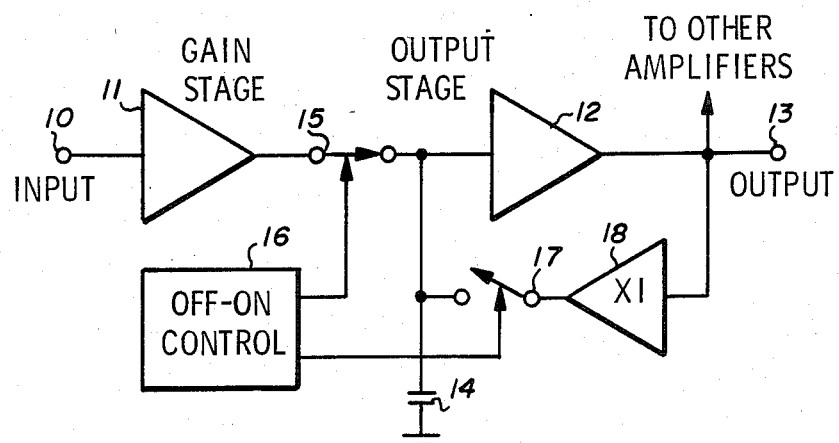
Fig_1
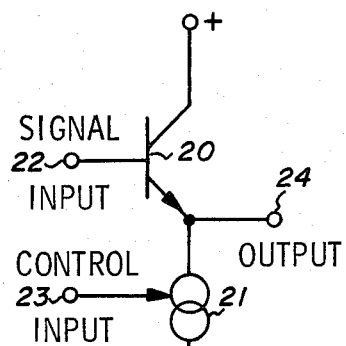
Fig_2
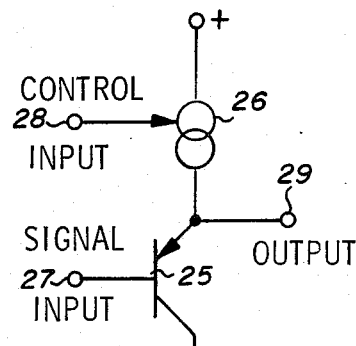
Fig_3
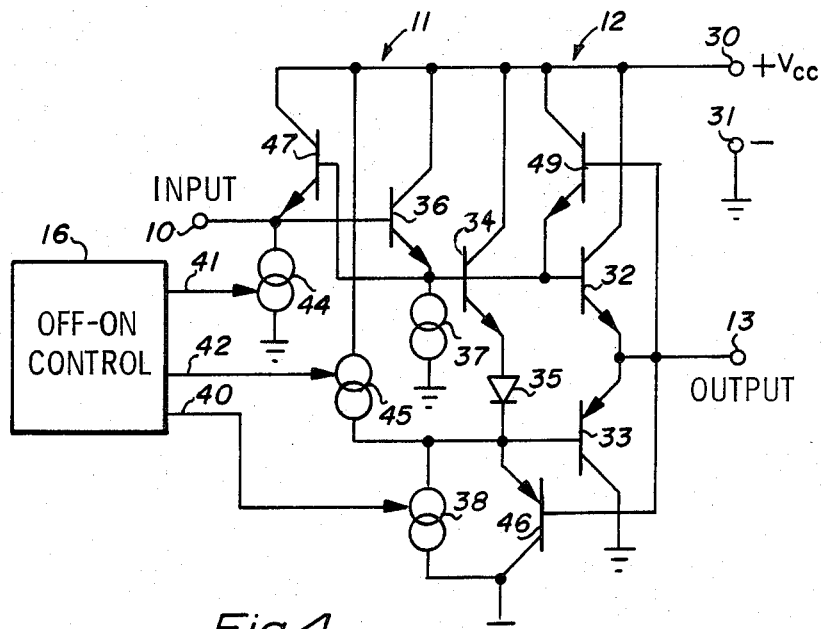
Fig_4

BISTATE LINEAR AMPLIFIER CIRCUIT

BACKGROUND OF THE INVENTION

Analog amplifiers normally have very low signal output impedances so that they can drive loads as constant voltage signal sources. Where more than one amplifier is employed to drive a common load, problems in load sharing develop. Such a situation can develop in a multiplex system where a plurality of signal sources are operated in a predetermined sequence to drive a common line. Where a plurality of signal amplifiers are coupled to a common line one way of control is to turn off the current flow in all but one amplifier. However, even when this is done some parasitic action can still be present. For example, in an output stage the input has stray shunt capacitance that will act to clamp the input potential. As the output varies the transistor bias varies. When the emitter-base diode is driven in the forward bias direction above one $V_{BE}$ the transistor will go into conduction. In the reverse bias state the emitter-base diode can be driven into zener breakdown at a relatively low level. Typically slightly over about six volts for a conventional integrated circuit (IC) transistor. Thus, the signal level must be low enough to avoid both forward conduction and zenering in all of the off amplifiers. Such a limitation is usually not acceptable in an operating system. Ordinarily signal channel switching is employed to selectively connect the desired driver amplifier to the common line. However, this requires highly conductive switching devices with one each for each amplifier channel. This kind of switching is commonly done with monopolar field effect transistors and their areas must be made quite large to obtain the required conductivity. It would be much more desirable to control the current flow inside the amplifiers themselves.

SUMMARY OF THE INVENTION

It is an object of the invention to provide a linear amplifier with control means that acts to prevent the output stage transistors from being driven into the forward conduction or the zener breakdown regions as a result of output voltage swing.

It is a further object of the invention to provide the output transistors in a linear amplifier with high speed unity gain buffer amplifiers that are turned on when the output stage is turned off so that any stray capacitance is charged or discharged as a function of the output voltage and the output transistors remain off.

These and other objects are obtained in a linear amplifier configured as follows. A power output stage is turned off by reducing its bias current to zero. At the same time a unity gain high speed buffer is coupled around the stage so that the input capacitance is rapidly charged and discharged in accordance with the output voltage. This prevents the output voltage swings from driving the output transistors into either forward conduction or reverse zener breakdown. Thus they will remain off regardless of output voltage signal levels.

BRIEF DESCRIPTION OF THE DRAWING

FIG. 1 is a block diagram of the circuit of the invention.

FIG. 2 is a schematic diagram of a unity gain high speed buffer suitable for practicing the invention using an NPN transistor.

FIG. 3 is a schematic diagram of a unity gain high speed buffer suitable for practicing the invention using a PNP transistor.

FIG. 4 is a schematic diagram of an IC amplifier employing the invention.

DESCRIPTION OF THE INVENTION

FIG. 1 is a block diagram of the circuit of the invention and represents a typical linear amplifier. Input terminal 10 is coupled to drive gain stage 11 wherein a substantial part of the amplifier current or voltage gain is realized. In ordinary usage gain stage 11 drives output stage 12 which provides the desired power output at terminal 13. Output stage 12 entails an unavoidable stray shunt capacitance 14 at its input. Switch 15 is operated by control 16 to interrupt the drive current to output stage 12 so as to turn the amplifier off. Switch 17, which is driven by control 16 is complementary fashion with switch 15, couples the output of unity gain buffer 18 to the input of output stage 12.

In the prior art where gain stage 11 directly drives output stage 12 and unity gain buffer 18 is omitted, when switch 15 is opened to turn the circuit off, capacitance 14 will still be present so as to clamp the potential at the input of output stage 12. When plural amplifiers are coupled to terminal 13, signals will be present at terminal 13 so that its potential will be varying. Thus, any output transistor will be subjected to a varying potential. For the case where the output stage includes an emitter follower transistor, the output terminal will vary the emitter and the capacitance will clamp the base so the emitter-base voltage will be varied. If the emitter base diode is driven in its forward bias direction to one $V_{BE}$ the transistor will become conductive even though it is supposed to be off. If the diode is driven in its reverse direction it can be driven into its zener region in which conduction occurs at a relatively low voltage. Thus even though turned off the output transistor can be driven into conduction by a signal from one of the other parallel connected amplifiers.

If unity gain buffer 18 is present, and switch 17 is closed, capacitance 14 will be charged and discharged in accordance with the potential at terminal 13. If the slew rate or speed of unity gain buffer 18 is made large enough, capacitance 14 can be charged and discharged rapidly enough so that the transistors in output stage 12 will never conduct appreciably. In other words amplifier 18 would be characterized as a fast unity gain buffer.

Such a function can be realized in a conventional IC by a transistor connected as an emitter follower working into a constant current load as shown in FIG. 2. The load 21 can be operated from a control circuit connected to terminal 23 to provide the switch function for the buffer. When the control input at terminal 23 turns current sink 21 off, the switch (17 of FIG. 1) is open. Actually, since the base current of transistor 20 must be supplied via terminal 22, the buffer acts as if switches are present at both the input and the output of the buffer. FIG. 3 shows a complementary version of the FIG. 2 circuit. PNP transistor 25 is preferably of the vertical form of construction and employs current source 26 as an emitter load. Base input terminal 27 provides the signal input and also passes the d-c base current bias. Control terminal 28 operates source 26 and these elements provide the buffer switch function.

In the circuits of both FIGS. 2 and 3 the voltage gain is very close to unity. In terms of d-c level FIG. 2 produces an input-to-output offset of $-V_{BE}$ while FIG. 3 produces a $+V_{BE}$ offset. Both circuits have high slew rates as is characteristic of emitter followers.

FIG. 4 is a schematic diagram of a circuit employing the invention. The circuit is intended for conventional PN junction isolated monolithic IC form and is operated from a $V_{CC}$ power supply coupled + to terminal 30 and − to ground terminal 31. NPN transistor 32 and PNP transistor 33 form a complementary output pair to make up output stage 12. Since a pair of output transistors are involved at least a pair of unity gain buffers will be needed to practice the invention as will be described hereinafter. NPN transistor 34 and diode 35 (which is typically a diode connected PNP transistor) bias and drive transistor 33 from the base of transistor 32 so that the output pair operates in Class B or Class AB as desired. Input transistor 36 is connected as an emitter follower driver having a large current gain coupled to drive the output stage 12 from input terminal 10.

Current sinks 37 and 38 set up the circuit operating conditions and are normally on. Control circuit 16 provides the desired turn on voltage for sink 38 via line 40. For this condition lines 41 and 42, will respectively bias constant current devices 44 and 45 off. This in turn will respectively turn transistors 47 and 46 off. In this state the circuit will operate conventionally as a signal amplifier.

When the amplifier is to be turned off line 40 turns off current sink 38. This turns transistor 34 and diode 35 off. At the same time line 41 turns current sink 44 on and line 42 turns current source 45 on. This in turn turns transistors 47 and 46 on.

In the amplifier off state current sink 37 will act to pull the base of transistor 32 down along with the emitters of transistors 36 and 49. Due to associated circuitry either transistor 36 or transistor 49 will conduct but not both. If current sink 44 is turned on via line 41, transistor 47 will be forced to conduct the current. Its conduction will force the base of transistor 36 to one $V_{BE}$ below its emitter. Thus, transistor 36 will be turned off by the action of a buffer in the form of transistor 47. This means that transistor 49 will be rendered conductive by virtue of current sink 37 pulling the emitter of transistor 49 below its base by one $V_{BE}$. This places the base of transistor 32 below its emitter so as to hold it off. Furthermore, any signal at terminal 13 will appear at the base of transistor 32 by virtue of transistor 49 acting as a fast unity gain buffer amplifier. Thus, while the base of transistor 32 may represent a substantial stray capacitance, it will be driven to follow the output terminal so that the NPN output transistor 32 will remain nonconductive.

Since line 42 has turned current source 45 on its current will flow in transistor 46 which is thereby on. In other words, source 45 will pull the emitter of transistor 46 one $V_{BE}$ above its base. This action holds transistor 33 off. Transistor 46 in its on state becomes a unity gain high speed buffer that will charge and discharge the stray capacitance at the base of transistor 33 in accordance with any signal at terminal 13.

When control 16 turns the circuit off it can be seen that the unity gain buffer amplifiers (transistors 47, 46, and 49) operate to charge and discharge the signal node stray capacitances so that the normal operating transistors remain off even though signals are present at the amplifier output.

The invention has been described and a preferred embodiment set forth. When a person skilled in the art reads the foregoing description, alternatives and equivalents, within the spirit and intent of the invention, will become apparent. Accordingly, it is intended that the scope of the invention be limited only by the following claims.

I claim:

1. A linear amplifier output stage circuit, adapted for coupling to a load element in common with one or more additional amplifiers, said output stage having input and output terminals and at least one output transistor connected to produce an amplified output signal at said output terminal in response to a signal at said input terminal, said circuit comprising:
   means for providing operating bias current for said output transistor;
   means for turning said operating bias current on and off in response to a control signal;
   unity gain buffer amplifier means having an input coupled to said output terminal and an output coupled to said output stage input terminal; and
   means for turning said buffer amplifier means on and off in complementary fashion with said operating bias current.

2. The circuit of claim 1 wherein said unity gain buffer amplifier comprises an emitter follower transistor having a constant current device in its emitter circuit.

3. The circuit of claim 2 wherein said means for turning said buffer amplifier means on and off comprise means for controlling the conduction of said constant current device.

4. The circuit of claim 1 wherein said output stage comprises a complementary pair of output transistors and said unity gain buffer amplifier means comprise first and second complementary emitter followers each one having its input coupled to said output terminal and respective outputs coupled to the inputs of said pair of output transistors.

5. The circuit of claim 4 further comprising a gain stage having an output coupled to drive said pair of output transistor, an input, and means for providing bias current for said gain stage.

6. The circuit of claim 5 further comprising a third emitter follower having an input coupled to said gain stage output, an output coupled to said gain stage input, and means for turning said third emitter follower on and off in complementary fashion with said operating bias current.

* * * * *